United States Patent
Lin et al.

(10) Patent No.: US 7,910,218 B2
(45) Date of Patent: Mar. 22, 2011

(54) CLEANING AND REFURBISHING CHAMBER COMPONENTS HAVING METAL COATINGS

(75) Inventors: Yixing Lin, Saratoga, CA (US); Dajiang Xu, Milpitas, CA (US); Clifford Stow, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 1505 days.

(21) Appl. No.: 10/691,418

(22) Filed: Oct. 22, 2003

(65) Prior Publication Data

US 2005/0089699 A1    Apr. 28, 2005

(51) Int. Cl.
*B32B 9/00*    (2006.01)

(52) U.S. Cl. .................................................. 428/469

(58) Field of Classification Search .................. 428/469, 428/408; 427/447, 453; 156/446, 345.1
See application file for complete search history.

(56) References Cited

U.S. PATENT DOCUMENTS

| | | |
|---|---|---|
| 2,705,500 A | 4/1955 | Deer |
| 3,117,883 A | 1/1964 | Pierett |
| 3,457,151 A | 7/1969 | Kortejarvi |
| 3,482,082 A | 12/1969 | Israeli |
| 3,522,083 A | 7/1970 | Woolman |
| 3,565,771 A | 2/1971 | Gulla |
| 3,679,460 A | 7/1972 | Reid |
| 4,100,252 A | 7/1978 | Pitts |
| RE31,198 E | 4/1983 | Binns |
| 4,412,133 A | 10/1983 | Eckes et al. |
| 4,419,201 A | 12/1983 | Levinstein et al. |
| 4,480,284 A | 10/1984 | Tojo et al. |
| 4,491,496 A | 1/1985 | Laporte et al. |
| 4,606,802 A | 8/1986 | Kobayashi et al. |
| 4,645,218 A | 2/1987 | Ooshio et al. |
| 4,665,463 A | 5/1987 | Ward et al. |
| 4,673,554 A | 6/1987 | Niwa et al. |
| 4,713,119 A | 12/1987 | Earhart et al. |
| 4,717,462 A | 1/1988 | Homma et al. |

(Continued)

FOREIGN PATENT DOCUMENTS

DE    19719133 A1    11/1998

(Continued)

OTHER PUBLICATIONS

U.S. Patent Application entitled, "Particle Removal From PVD Chamber Components With High Pressure Water"; filed Sep. 2, 2003; U.S. Appl. No. 10/653,713; Inventors: .West et al.

(Continued)

*Primary Examiner* — Angela Ortiz
*Assistant Examiner* — Daniel Miller
(74) *Attorney, Agent, or Firm* — Janah & Associates, P.C.

(57) ABSTRACT

A component of a process chamber is refurbished and cleaned to remove an intermetallic compound from the component. The component has a structure having a coating that includes a first metal layer over the intermetallic compound. To refurbish the component, the first metal layer is removed to form an exposed surface that at least partially includes the intermetallic compound. The exposed surface is bead blasted in a penetrative bead blasting step by propelling blasting beads having a bead diameter of less than about 180 micrometers with a gas that is pressurized to a pressure of less than about 310 kPa (45 psi), towards the exposed surface, thereby removing the intermetallic compound from the exposed surface of the structure to form a cleaned surface. A second metal layer is then formed over the cleaned surface.

23 Claims, 4 Drawing Sheets

U.S. PATENT DOCUMENTS

| | | |
|---|---|---|
| 4,732,792 A | 3/1988 | Fujiyama |
| 4,756,322 A | 7/1988 | Lami |
| 4,832,781 A | 5/1989 | Mears |
| 4,872,250 A | 10/1989 | De Marco |
| 4,913,784 A | 4/1990 | Bogenshutz et al. |
| 4,959,105 A | 9/1990 | Neidiffer et al. |
| 4,995,958 A | 2/1991 | Anderson et al. |
| 4,996,859 A | 3/1991 | Rose et al. |
| 5,009,966 A * | 4/1991 | Garg et al. .................... 428/627 |
| 5,032,469 A | 7/1991 | Merz et al. |
| 5,055,964 A | 10/1991 | Logan et al. |
| 5,064,511 A | 11/1991 | Gobbetti |
| 5,104,501 A | 4/1992 | Okabayashi |
| 5,104,834 A | 4/1992 | Watanabe et al. |
| 5,117,121 A | 5/1992 | Watanabe et al. |
| 5,151,845 A | 9/1992 | Watanabe et al. |
| 5,164,016 A | 11/1992 | Henriet et al. |
| 5,166,856 A | 11/1992 | Liporace et al. |
| 5,180,322 A | 1/1993 | Yamamoto et al. |
| 5,180,563 A | 1/1993 | Lai et al. |
| 5,191,506 A | 3/1993 | Logan et al. |
| 5,202,008 A | 4/1993 | Talieh |
| 5,215,624 A | 6/1993 | Dastolfo et al. |
| 5,215,639 A | 6/1993 | Boys |
| 5,248,386 A | 9/1993 | Dastolfo et al. |
| 5,258,047 A | 11/1993 | Tokisue et al. |
| 5,270,266 A | 12/1993 | Hirano et al. |
| 5,275,683 A | 1/1994 | Arami et al. |
| 5,280,156 A | 1/1994 | Niori et al. |
| 5,314,597 A | 5/1994 | Harra |
| 5,315,473 A | 5/1994 | Collins et al. |
| 5,324,053 A | 6/1994 | Kubota et al. |
| 5,325,261 A | 6/1994 | Horwitz |
| 5,338,367 A | 8/1994 | Henriet et al. |
| 5,350,479 A | 9/1994 | Collins et al. |
| 5,356,723 A | 10/1994 | Kimoto et al. |
| 5,366,585 A | 11/1994 | Robertson et al. |
| 5,382,469 A | 1/1995 | Kubota et al. |
| 5,391,275 A | 2/1995 | Mintz |
| 5,401,319 A | 3/1995 | Banholzer et al. |
| 5,407,551 A | 4/1995 | Sieck et al. |
| 5,409,590 A | 4/1995 | Hurwitt et al. |
| 5,429,711 A | 7/1995 | Watanabe et al. |
| 5,433,835 A | 7/1995 | Demaray et al. |
| 5,458,759 A | 10/1995 | Hosokawa et al. |
| 5,460,694 A | 10/1995 | Schapira et al. |
| 5,463,526 A | 10/1995 | Mundt |
| 5,474,649 A | 12/1995 | Kava et al. |
| 5,487,822 A | 1/1996 | Demaray et al. |
| 5,490,913 A | 2/1996 | Schertler et al. |
| 5,509,558 A | 4/1996 | Imai et al. |
| 5,512,078 A | 4/1996 | Griffin |
| 5,520,740 A | 5/1996 | Kanai et al. |
| 5,531,835 A | 7/1996 | Fodor et al. |
| 5,536,723 A | 7/1996 | Loscalzo et al. |
| 5,542,559 A | 8/1996 | Kawakami et al. |
| 5,549,802 A | 8/1996 | Guo |
| 5,587,039 A | 12/1996 | Salimian et al. |
| 5,614,071 A | 3/1997 | Mahvan et al. |
| 5,643,422 A | 7/1997 | Yamada |
| 5,660,640 A | 8/1997 | Laube |
| 5,671,835 A | 9/1997 | Tanaka et al. |
| 5,684,669 A | 11/1997 | Collins et al. |
| 5,685,914 A | 11/1997 | Hills et al. |
| 5,685,959 A | 11/1997 | Bourez et al. |
| 5,695,825 A | 12/1997 | Scruggs |
| 5,700,179 A | 12/1997 | Hasegawa et al. |
| 5,714,010 A | 2/1998 | Matsuyama et al. |
| 5,720,818 A | 2/1998 | Donde et al. |
| 5,736,021 A | 4/1998 | Ding et al. |
| 5,745,331 A | 4/1998 | Shamoulian et al. |
| 5,755,887 A | 5/1998 | Sano et al. |
| 5,762,748 A | 6/1998 | Banholzer et al. |
| 5,792,562 A | 8/1998 | Collins et al. |
| 5,808,270 A | 9/1998 | Marantz et al. |
| 5,812,362 A | 9/1998 | Ravi |
| 5,821,166 A | 10/1998 | Hajime et al. |
| 5,824,197 A | 10/1998 | Tanaka |
| 5,830,327 A | 11/1998 | Kolnekow |
| 5,840,434 A | 11/1998 | Kojima et al. |
| 5,858,100 A | 1/1999 | Maeda et al. |
| 5,876,573 A | 3/1999 | Moslehi et al. |
| 5,879,523 A | 3/1999 | Wang et al. |
| 5,879,524 A | 3/1999 | Hurwitt et al. |
| 5,885,428 A | 3/1999 | Kogan |
| 5,886,863 A | 3/1999 | Nagasaki et al. |
| 5,903,428 A | 5/1999 | Grimard et al. |
| 5,910,338 A | 6/1999 | Donde et al. |
| 5,916,378 A | 6/1999 | Bailey et al. |
| 5,916,454 A | 6/1999 | Richardson et al. |
| 5,920,764 A | 7/1999 | Hanson |
| 5,930,661 A | 7/1999 | Lu |
| 5,939,146 A | 8/1999 | Lavernia |
| 5,942,041 A | 8/1999 | Lo et al. |
| 5,942,445 A | 8/1999 | Kato et al. |
| 5,948,288 A | 9/1999 | Treves et al. |
| 5,951,374 A | 9/1999 | Kato et al. |
| 5,953,827 A | 9/1999 | Or et al. |
| 5,963,778 A | 10/1999 | Stellrecht |
| 5,967,047 A | 10/1999 | Ag |
| 5,976,327 A | 11/1999 | Tanaka |
| 6,010,583 A | 1/2000 | Annavarapu et al. |
| 6,015,465 A | 1/2000 | Kholodenko et al. |
| 6,026,666 A | 2/2000 | Zimmermann et al. |
| 6,027,604 A | 2/2000 | Lim et al. |
| 6,051,114 A | 4/2000 | Yao et al. |
| 6,051,122 A | 4/2000 | Flanigan |
| 6,059,945 A | 5/2000 | Fu et al. |
| 6,071,389 A | 6/2000 | Zhang |
| 6,073,830 A | 6/2000 | Hunt et al. |
| 6,086,735 A | 7/2000 | Gilman et al. |
| 6,108,189 A | 8/2000 | Weldon et al. |
| 6,120,621 A | 9/2000 | Jin et al. |
| 6,120,640 A | 9/2000 | Shih et al. |
| 6,143,432 A | 11/2000 | de Rochemont et al. |
| 6,146,509 A | 11/2000 | Aragon |
| 6,149,784 A | 11/2000 | Su et al. |
| 6,150,762 A | 11/2000 | Kim et al. |
| 6,152,071 A | 11/2000 | Akiyama et al. |
| 6,159,299 A | 12/2000 | Koai et al. |
| 6,162,297 A | 12/2000 | Mintz et al. |
| 6,162,336 A | 12/2000 | Lee |
| 6,170,429 B1 | 1/2001 | Schoepp et al. |
| 6,183,614 B1 | 2/2001 | Fu |
| 6,183,686 B1 | 2/2001 | Bardus et al. |
| 6,190,516 B1 | 2/2001 | Xiong et al. |
| 6,198,067 B1 | 3/2001 | Ikeda et al. |
| 6,199,259 B1 | 3/2001 | Demaray et al. |
| 6,221,217 B1 | 4/2001 | Moslehi et al. |
| 6,227,435 B1 | 5/2001 | Lazarz et al. |
| 6,235,163 B1 | 5/2001 | Angalo et al. |
| 6,238,528 B1 | 5/2001 | Xu et al. |
| 6,248,667 B1 | 6/2001 | Kim et al. |
| 6,250,251 B1 | 6/2001 | Akiyama et al. |
| 6,269,670 B2 | 8/2001 | Koestermeier |
| 6,274,008 B1 | 8/2001 | Gopalraja et al. |
| 6,276,997 B1 | 8/2001 | Li |
| 6,280,584 B1 | 8/2001 | Kumar et al. |
| 6,284,093 B1 | 9/2001 | Ke et al. |
| 6,287,437 B1 | 9/2001 | Pandhumsoporn et al. |
| 6,299,740 B1 | 10/2001 | Hieronymi et al. |
| 6,306,489 B1 | 10/2001 | Hellmann et al. |
| 6,306,498 B1 | 10/2001 | Quarzglas |
| 6,338,781 B1 | 1/2002 | Sichmann et al. |
| 6,338,906 B1 | 1/2002 | Ritland et al. |
| 6,340,415 B1 | 1/2002 | Raaijmakers et al. |
| 6,344,114 B1 | 2/2002 | Sichmann et al. |
| 6,364,957 B1 | 4/2002 | Schneider et al. |
| 6,365,010 B1 | 4/2002 | Hollars |
| 6,372,609 B1 | 4/2002 | Aga |
| 6,379,575 B1 | 4/2002 | Yin et al. |
| 6,383,459 B1 | 5/2002 | Singh et al. |
| 6,387,809 B2 | 5/2002 | Toyama |
| 6,394,023 B1 | 5/2002 | Crocker |
| 6,401,652 B1 | 6/2002 | Mohn et al. |
| 6,416,634 B1 | 7/2002 | Mostovoy et al. |
| 6,423,175 B1 | 7/2002 | Huang et al. |

| | | |
|---|---|---|
| 6,444,083 B1 | 9/2002 | Steger et al. |
| 6,447,853 B1 | 9/2002 | Suzuki et al. |
| 6,454,870 B1 | 9/2002 | Brooks |
| 6,464,794 B1 | 10/2002 | Park et al. |
| 6,475,336 B1 | 11/2002 | Hubacek |
| 6,500,321 B1 | 12/2002 | Ashtiani et al. |
| 6,506,312 B1 | 1/2003 | Bottomfield |
| 6,545,267 B1 | 4/2003 | Miura et al. |
| 6,555,471 B2 | 4/2003 | Sandhu et al. |
| 6,558,505 B2 | 5/2003 | Suzuki et al. |
| 6,565,984 B1 | 5/2003 | Wu et al. |
| 6,566,161 B1 | 5/2003 | Rosenberg et al. |
| 6,576,909 B2 | 6/2003 | Donaldson et al. |
| 6,579,431 B1 | 6/2003 | Bolcavage et al. |
| 6,592,830 B1 | 7/2003 | Krupin et al. |
| 6,599,405 B2 | 7/2003 | Hunt et al. |
| 6,619,537 B1 | 9/2003 | Zhang et al. |
| 6,620,736 B2 | 9/2003 | Drewery |
| 6,623,595 B1 | 9/2003 | Han et al. |
| 6,623,597 B1 | 9/2003 | Han et al. |
| 6,623,610 B1 | 9/2003 | Onishi |
| 6,627,050 B2 | 9/2003 | Miller et al. |
| H2087 H | 11/2003 | Balliett et al. |
| 6,645,357 B2 | 11/2003 | Powell |
| 6,652,668 B1 | 11/2003 | Perry et al. |
| 6,652,716 B2 | 11/2003 | Kao et al. |
| 6,660,135 B2 | 12/2003 | Yu et al. |
| 6,676,812 B2 | 1/2004 | Chung |
| 6,708,870 B2 | 3/2004 | Koenigsmann et al. |
| 6,743,340 B2 | 6/2004 | Fu |
| 6,749,103 B1 | 6/2004 | Ivanov et al. |
| 6,776,879 B2 | 8/2004 | Yamamoto et al. |
| 6,777,045 B2 | 8/2004 | Lin et al. |
| 6,797,362 B2 | 9/2004 | Parfeniuk et al. |
| 6,797,639 B2 | 9/2004 | Carducci et al. |
| 6,812,471 B2 | 11/2004 | Popiolkowski et al. |
| 6,824,652 B2 | 11/2004 | Park |
| 6,840,427 B2 | 1/2005 | Ivanov |
| 6,858,116 B2 | 2/2005 | Okabe et al. |
| 6,872,284 B2 | 3/2005 | Ivanov et al. |
| 6,902,627 B2 | 6/2005 | Brueckner et al. |
| 6,902,628 B2 * | 6/2005 | Wang et al. ............ 134/26 |
| 6,916,407 B2 | 7/2005 | Vosser et al. |
| 6,933,025 B2 | 8/2005 | Lin et al. |
| 6,933,508 B2 | 8/2005 | Popiolkowski et al. |
| 6,955,748 B2 | 10/2005 | Kim |
| 6,955,852 B2 | 10/2005 | Ivanov |
| 6,992,261 B2 | 1/2006 | Kachalov et al. |
| 7,026,009 B2 | 4/2006 | Lin et al. |
| 7,041,200 B2 | 5/2006 | Le et al. |
| 7,063,773 B2 | 6/2006 | Ivanov et al. |
| 7,121,938 B2 | 10/2006 | Suzuki |
| 7,131,883 B2 | 11/2006 | Park et al. |
| 7,146,703 B2 | 12/2006 | Ivanov |
| 7,264,679 B2 | 9/2007 | Schweitzer et al. |
| 7,504,008 B2 | 3/2009 | Doan et al. |
| 7,579,067 B2 | 8/2009 | Lin et al. |
| 7,618,769 B2 | 11/2009 | Brueckner et al. |
| 2001/0001367 A1 | 5/2001 | Koestermeier |
| 2001/0033706 A1 | 10/2001 | Shimomura et al. |
| 2001/0045353 A1 | 11/2001 | Hieronymi et al. |
| 2002/0029745 A1 | 3/2002 | Nagaiwa et al. |
| 2002/0033330 A1 | 3/2002 | Demaray et al. |
| 2002/0076490 A1 | 6/2002 | Chiang et al. |
| 2002/0086118 A1 | 7/2002 | Chang et al. |
| 2002/0090464 A1 | 7/2002 | Mingwei et al. |
| 2002/0100680 A1 | 8/2002 | Yamamoto et al. |
| 2003/0019746 A1 | 1/2003 | Ford et al. |
| 2003/0026917 A1 * | 2/2003 | Lin et al. ............ 427/453 |
| 2003/0047464 A1 | 3/2003 | Sun et al. |
| 2003/0108680 A1 | 6/2003 | Gell et al. |
| 2003/0116276 A1 | 6/2003 | Weldon et al. |
| 2003/0118731 A1 | 6/2003 | He et al. |
| 2003/0127319 A1 | 7/2003 | Demaray et al. |
| 2003/1364248 | 7/2003 | Krogh |
| 2003/0168168 A1 | 9/2003 | Liu et al. |
| 2003/0170486 A1 | 9/2003 | Austin et al. |
| 2003/0173526 A1 | 9/2003 | Popiolkowski et al. |
| 2003/0185965 A1 * | 10/2003 | Lin et al. ............ 427/8 |
| 2003/0196890 A1 | 10/2003 | Le et al. |
| 2003/0218054 A1 | 11/2003 | Koenigsmann et al. |
| 2003/0221702 A1 | 12/2003 | Peebles |
| 2004/0045574 A1 | 3/2004 | Tan |
| 2004/0056070 A1 | 3/2004 | Ivanov |
| 2004/0056211 A1 | 3/2004 | Popiolkowski et al. |
| 2004/0079634 A1 | 4/2004 | Wickersham et al. |
| 2004/0099285 A1 | 5/2004 | Wang et al. |
| 2004/0113364 A1 | 6/2004 | Ivanov |
| 2004/0180158 A1 | 9/2004 | Lin et al. |
| 2004/0256226 A1 | 12/2004 | Wickersham |
| 2004/0261946 A1 | 12/2004 | Endoh et al. |
| 2005/0011749 A1 | 1/2005 | Kachalov et al. |
| 2005/0028838 A1 | 2/2005 | Brueckner |
| 2005/0048876 A1 | 3/2005 | West et al. |
| 2005/0061857 A1 | 3/2005 | Hunt et al. |
| 2005/0067469 A1 | 3/2005 | Facey et al. |
| 2005/0089699 A1 | 4/2005 | Lin et al. |
| 2005/0092604 A1 | 5/2005 | Ivanov |
| 2005/0098427 A1 | 5/2005 | Cho et al. |
| 2005/0147150 A1 | 7/2005 | Wickersham et al. |
| 2005/0161322 A1 | 7/2005 | Smathers |
| 2005/0178653 A1 | 8/2005 | Fisher |
| 2005/0211548 A1 | 9/2005 | Gung et al. |
| 2005/0238807 A1 | 10/2005 | Lin |
| 2005/0271984 A1 | 12/2005 | Brueckner et al. |
| 2005/0282358 A1 | 12/2005 | Di Cioccio et al. |
| 2005/0284372 A1 | 12/2005 | Murugesh et al. |
| 2006/0005767 A1 | 1/2006 | Tsai et al. |
| 2006/0070876 A1 | 4/2006 | Wu et al. |
| 2006/0090706 A1 | 5/2006 | Miller et al. |
| 2006/0105182 A1 | 5/2006 | Brueckner et al. |
| 2006/0108217 A1 | 5/2006 | Krempel-Hesse et al. |
| 2006/0110620 A1 | 5/2006 | Lim et al. |
| 2006/0188742 A1 | 8/2006 | West et al. |
| 2006/0251822 A1 | 11/2006 | Gell et al. |
| 2006/0283703 A1 | 12/2006 | Lee et al. |
| 2007/0059460 A1 | 3/2007 | Abney et al. |
| 2007/0102286 A1 | 5/2007 | Scheible et al. |
| 2007/0113783 A1 | 5/2007 | Lee et al. |
| 2007/0125646 A1 | 6/2007 | Young et al. |
| 2007/0170052 A1 | 7/2007 | Ritchie et al. |
| 2007/0215463 A1 | 9/2007 | Parkhe et al. |
| 2007/0283884 A1 | 12/2007 | Tiller et al. |
| 2008/0178801 A1 | 7/2008 | Pavloff et al. |
| 2008/0257263 A1 | 10/2008 | Pavloff et al. |

FOREIGN PATENT DOCUMENTS

| | | |
|---|---|---|
| EP | 0439000 | 7/1991 |
| EP | 0239349 | 7/1992 |
| EP | 0601788 | 6/1994 |
| EP | 0635869 | 1/1995 |
| EP | 0791956 | 8/1997 |
| EP | 0818803 A | 1/1998 |
| EP | 0838838 | 4/1998 |
| EP | 0838838 A2 | 4/1998 |
| EP | 0845545 A1 | 6/1998 |
| EP | 1049133 A2 | 11/2000 |
| EP | 1094496 A | 4/2001 |
| EP | 1158072 A2 | 11/2001 |
| EP | 1258908 A2 | 11/2002 |
| FR | 2562097 A1 | 10/1985 |
| GB | 1424365 A | 2/1976 |
| JP | 54162696 | 12/1979 |
| JP | 54162969 | 12/1979 |
| JP | 11-59368 | 12/1987 |
| JP | 63235435 | 9/1988 |
| JP | 02-027748 | 1/1990 |
| JP | 02-101157 | 4/1990 |
| JP | 03-138354 | 6/1991 |
| JP | 06-232243 | 8/1994 |
| JP | 07-197272 | 8/1995 |
| JP | 09-017850 | 1/1997 |
| JP | 09-272965 | 10/1997 |
| JP | 10-045461 | 2/1998 |
| JP | 63149396 | 6/1998 |
| JP | 10-251871 | 9/1998 |
| JP | 10-330971 | 12/1998 |
| JP | 11-137440 | 5/1999 |

| | | |
|---|---|---|
| JP | 11-220164 | 8/1999 |
| JP | 11-283972 | 10/1999 |
| JP | 2000-228398 | 10/1999 |
| JP | 2250990 | 10/1999 |
| JP | 11-345780 | 12/1999 |
| JP | 2000-072529 | 3/2000 |
| JP | 2000-191370 | 7/2000 |
| JP | 2002-069695 | 3/2002 |
| JP | 2002-069696 | 3/2002 |
| TW | 546680 | 8/2003 |
| WO | WO-9523428 | 8/1995 |
| WO | WO-9708734 | 3/1997 |
| WO | WO-9742648 | 11/1997 |
| WO | WO-98/50599 | 11/1998 |
| WO | WO-9852208 | 11/1998 |
| WO | WO-9903131 | 1/1999 |
| WO | WO-9913126 | 3/1999 |
| WO | WO-9913545 | 3/1999 |
| WO | WO-9914788 | 3/1999 |
| WO | 9917336 | 4/1999 |
| WO | WO-99/17336 | 4/1999 |
| WO | WO-9928945 | 6/1999 |
| WO | WO-9941426 | 8/1999 |
| WO | WO-0005751 | 2/2000 |
| WO | WO-0026939 | 5/2000 |
| WO | WO-0184590 | 11/2001 |
| WO | WO-0184624 A2 | 11/2001 |
| WO | WO-02/15255 | 2/2002 |
| WO | WO-0223587 | 3/2002 |
| WO | WO 02/093624 | 11/2002 |
| WO | WO-03015137 | 2/2003 |
| WO | WO-03057943 | 7/2003 |
| WO | WO-03076683 | 9/2003 |
| WO | WO-03/083160 | 10/2003 |
| WO | WO-03083160 | 10/2003 |
| WO | WO-03087427 | 10/2003 |
| WO | WO-03090248 | 10/2003 |
| WO | WO-2004/010494 A2 | 1/2004 |
| WO | WO-2004012242 | 2/2004 |
| WO | WO-2004015736 | 2/2004 |
| WO | WO-2004074932 | 9/2004 |
| WO | WO-2004094702 | 11/2004 |
| WO | WO-2005021173 | 3/2005 |
| WO | WO 2005/071137 | 8/2005 |
| WO | WO-2006053231 | 5/2006 |
| WO | WO-2006/073585 | 7/2006 |
| WO | WO-2006073585 | 7/2006 |
| WO | WO-2007-030824 | 3/2007 |
| WO | WO 2008/079722 | 7/2008 |
| WO | WO-2008079722 | 7/2008 |
| WO | WO-2008-133876 | 11/2008 |
| WO | WO-2008-153785 | 12/2008 |

OTHER PUBLICATIONS

U.S. Patent Application entitled, "Method of Cleaning a Coated Process Chamber Component"; filed Nov. 25, 2002; U.S. Appl. No. 10/304,535; Inventors: Wang et al.

U.S. Appl. No. 60/304,091, filed Jul. 9, 2001, Gell et al.

Rosenberg, R.W., "Increasing PVD Tool Uptime and Particle Control with Twin-Wire-Arc Spray Coatings," Mar. 2001, pp. 103-105, 108, 111, vol. 19, No. 3, Cannon Comm., Santa Monica, California.

European Patent Office, International Preliminary Report on Patentability/Written Opinion of the ISA, in PCT Appl. No. PCT/US2008/005183, Nov. 5, 2009, Munich (DE).

Final Office Action in U.S. Appl. No. 10/981,261 dated Dec. 16, 2008.

Final Office Action in U.S. Appl. No. 10/981,261 dated Oct. 30, 2007.

Nakasuji, et al., "Low Voltage and High Speed Operating Electrostatic Wafer Chuck," J. Vac. Sci. Technol. A, 10(6):3573-3578 (Nov./Dec. 1992).

Non-Final Office Action from U.S. Appl. No. 10/981,261 dated Mar. 6, 2009.

Non-Final Office Action in U.S. Appl. No. 10/981,261 dated Jun. 4, 2008.

Non-Final Office Action in U.S. Appl. No. 10/981,261 dated May 17, 2007.

Non-Final Office Action in U.S. Appl. No. 11/738,788 dated Dec. 29, 2009.

Rosenberg, RW, "Increasing PVD Tool Uptime and Particle Control with Twin-Wire-Arc Spray Coatings", Mar. 2001, p. 103-105, 108, 11, vol. 19, No. 3, Cannon Comm., Santa Monic, CA.

Tucker, Jr., Robert C., "Plasma and Detonation Gun Deposition Techniques and Coating Properties," Union Carbide Corp., Coatings Service Dept., Indianapolis, IN, pp. 454-489.

U.S. Appl. No. 60/739,658, to Young et al., filed Nov. 25, 2005.

U.S. Appl. No. 60/788,378, to Ritchie et al., filed Mar. 30, 2006.

Watanabe, et al., "Effect of Additives on the Electrostatic Force of Alumina Electrostatic Chucks," J. of the Ceramic Soc. of Jpn., 100(1):1-6 (1992).

* cited by examiner

Removing a first metal layer from an underlying structure to expose a surface having an intermetallic compound.

Performing a penetrative bead blasting step to remove the intermetallic compound.

Performing a texturizing bead blasting step to roughen the surface to a predetermined average surface roughness.

Forming a second metal layer over the surface.

FIG. 3

CLEANING AND REFURBISHING CHAMBER COMPONENTS HAVING METAL COATINGS

BACKGROUND

Embodiments of the present invention relate to a method of cleaning and refurbishing process chamber components.

A substrate processing chamber is used to process a substrate in an energized process gas to manufacture electronic circuits, such as integrated circuit chips and displays. Typically, the process chamber comprises an enclosure wall that encloses a process zone into which a process gas is introduced, a gas energizer to energize the gas, and an exhaust system to exhaust and control the pressure of the gas. Components of the chamber, such as chamber walls, liners and depositions rings, are susceptible to corrosion by the energized gas used to process the substrate, especially when the process gas contains halogen species. Corrosion resistance can be improved by forming a corrosion resistant coating over the component, such as a twin-wire arc sprayed aluminum coating. The coating can also have a textured surface to which process residues adhere, thus inhibiting accumulated process residues from flaking off and contaminating the substrates being processed in the chamber.

Such coated components often require frequent cleaning and refurbishing to retain their properties. For example, when such chamber components are used in PVD processes to sputter deposit material onto a substrate from a target, the sputtered material also accumulates on the surfaces of the component. The accumulated process deposits cause thermal expansion stresses that result in delamination, cracking, and flaking-off of the coating from the underlying structure. The plasma in the chamber can penetrate through damaged areas of the coating to erode the exposed surfaces of the underlying structure, eventually leading to failure of the component. Thus, a refurbishing process is typically performed to clean and refurbish the coated component after a number of substrates have been processed. The refurbishment process may involve removing process deposits, such as sputtered material, that has accumulated on the coating surface, and re-coating the component with a corrosion resistant material. The refurbishment process reduces the incidence of spalling or peeling of the coating from the component during the processing of substrates, and thus reduces the contamination of substrates processed in the chamber.

In one conventional refurbishing process, a metal component is cleaned with an acidic and a basic cleaning solution to remove process residues accumulated on the coating as well as to dissolve and remove the metal coating from the component, as described for example in U.S. patent application Ser. No. 10/304,535, to Wang et al, filed on Nov. 25, 2002, and commonly assigned to Applied Materials, which is herein incorporated by reference in its entirety. The surface of the component is then grit blasted in a relatively harsh and aggressive bead blasting process that re-textures the surface of the component to provide a desired surface roughness, and thereby improves adhesion of a subsequently applied coating. The relatively harsh bead blasting step utilizes relatively large bead particles having a size of at least about 600 micrometers and a high bead blasting pressure of at least about 483 kPa (70 psi) to re-texture the surface and provide a surface having an average surface roughness of at least about 6.35 micrometers (250 microinches.) After bead blasting, the coating is re-applied to the component, for example in a twin wire arc spraying process.

However, a problem with the above-described process is that it typically fails to adequately remove sufficient amounts of intermetallic compounds that can develop at the interface between the metal coating and underlying metal component, and which are believed to result from thermal cycling of the parts in the process chamber. The intermetallic compounds weaken the bond between the coating and component and can cause spalling of the coating from the component, which can reduce the component part life as well as cause contamination of the substrates by the spalled coating materials. A large number of these intermetallic compounds can accumulate when process chamber temperatures above about 300° C. are used, and when processing large numbers of substrates without intervening component refurbishment steps.

Thus, it is desirable to have a process of refurbishing and cleaning a coated component to provide improved corrosion resistance of the component and a longer component chamber use life. In particular, it is desirable to have a process of refurbishing and cleaning a coated component that substantially entirely removes intermetallic compounds from the component to provide improved bonding between the coating and underlying component.

SUMMARY

A component of a process chamber is cleaned and refurbished to remove an intermetallic compound from the component surface. The component has a structure having a coating that includes a first metal layer over the intermetallic compound. To refurbish the component, the first metal layer is removed to form an exposed surface that at least partially includes the intermetallic compound. The first metal layer can be removed by, for example, immersing a surface of the first metal layer in a cleaning solution, such as an acidic or basic solution that at least partially dissolves the metal layer. The exposed surface is bead blasted in a penetrative bead blasting step by propelling blasting beads having a bead diameter of less than about 180 micrometers with a gas that is pressurized to a pressure of less than about 310 kPa (45 psi), towards the exposed surface, thereby removing the intermetallic compound from the exposed surface of the structure to form a cleaned surface. A second metal layer is then formed over the cleaned surface, for example by a twin-wire arc thermal spraying method.

The cleaned surface can also be texturized to provide a predetermined surface roughness by performing a texturizing bead blasting step that is performed before the second metal layer is formed over the surface. The texturizing bead blasting step includes propelling blasting beads having a bead diameter of greater than about 400 micrometers with a gas that is pressurized to a pressure of at least about 276 kPa (40 psi) towards the surface, thereby forming a textured surface having a surface roughness average of from about 3.81 micrometers (150 microinches) to about 8.89 micrometers (350 microinches.).

DRAWINGS

These features, aspects, and advantages of the present invention will become better understood with regard to the following description, appended claims, and accompanying drawings, which illustrate examples of the invention. However, it is to be understood that each of the features can be used in the invention in general, not merely in the context of the particular drawings, and the invention includes any combination of these features, where:

DESCRIPTION

Figure 1A:
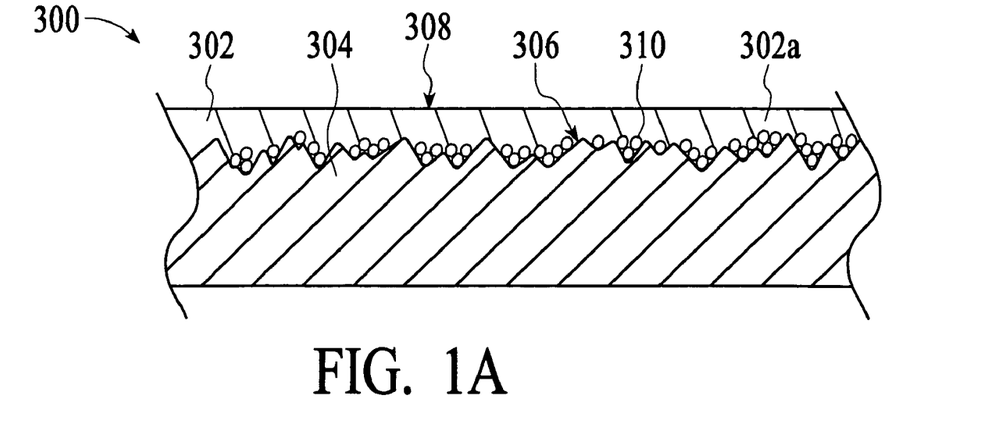
FIG. 1a is a schematic side view of an embodiment of a component having an overlying coating and having intermetallic compounds between the coating and an underlying structure of the component.
Figure 3:
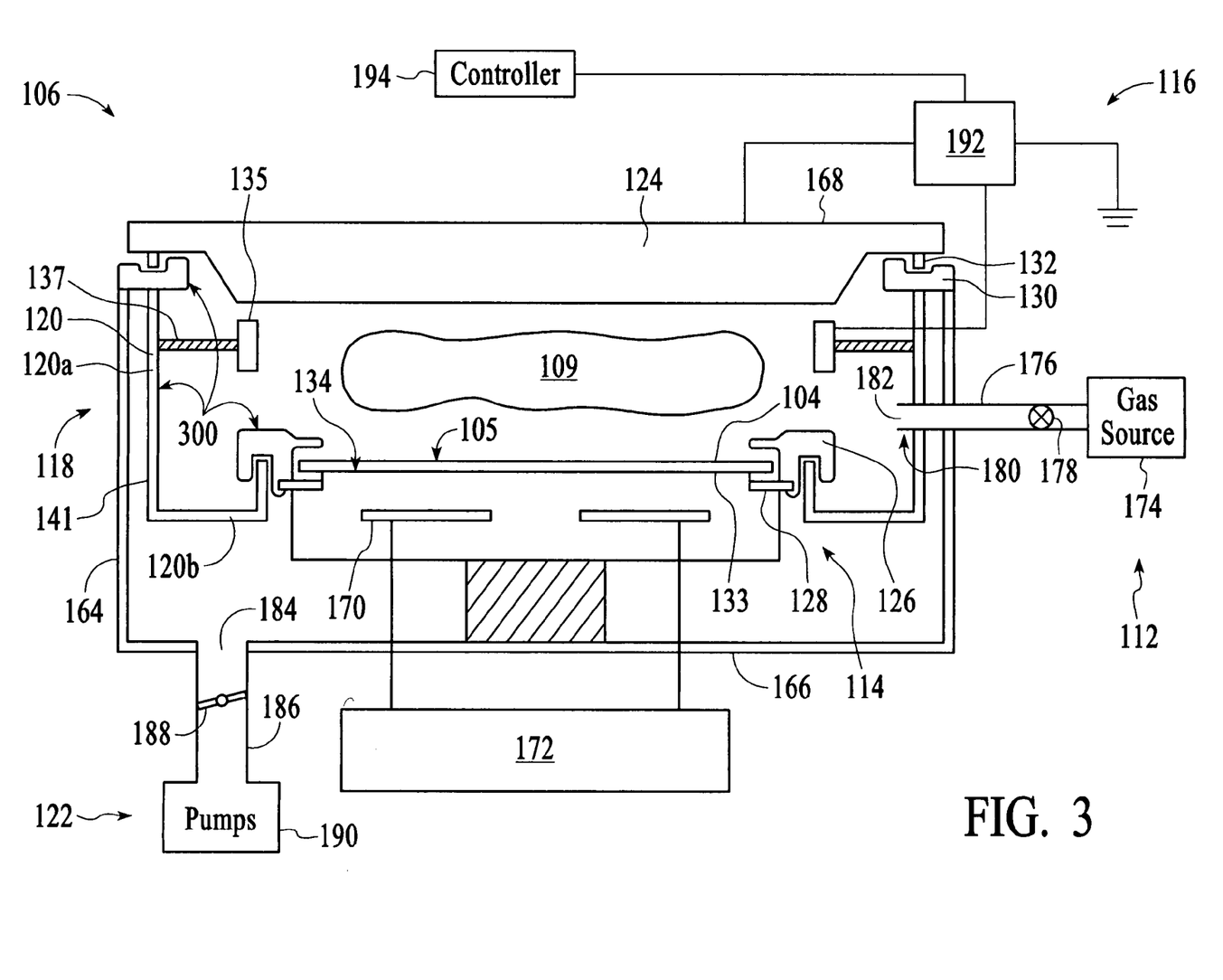
FIG. 3 is a sectional side view of an embodiment of a process chamber having one or more coated components.

The present process is suitable for cleaning and refurbishing a component 300 having a coating 302, as shown for example in FIG. 1a. The process may be used to clean and refurbish one or more of components 300 in the chamber 106 that are susceptible to erosion, such as for example, portions of one or more of a gas delivery system 112 that provides process gas in the chamber 106, a substrate support 114 that supports the substrate 104 in the chamber 106, a gas energizer 116 that energizes the process gas, chamber enclosure walls 118 and shields 120, and a gas exhaust 122 that exhausts gas from the chamber 106, exemplary embodiments of all of which are shown in FIG. 3. For example, in a physical vapor deposition chamber 106, the coated components 300 can comprise any of a chamber enclosure wall 118, a chamber shield 120, a target 124, a cover ring 126, a deposition ring 128, a support ring 130, insulator ring 132, a coil 135, coil support 137, shutter disk 133, clamp shield 141, and a surface 134 of the substrate support 114.

The chamber component 300 comprises an underlying structure 304 having an overlying coating 302 that covers at least a portion of the structure 304, as shown in FIG. 1a. The underlying structure 304 comprises a metal material that is resistant to erosion from an energized gas, such as an energized gas formed in a substrate processing environment. For example, the structure 304 can comprise at least one of aluminum, titanium, stainless steel, copper and tantalum. An upper surface 306 of the structure 304 contacts the coating 302, and has a surface roughness that improves adhesion of the overlying coating 302 to the structure 304. For example, the upper surface 306 can have a surface roughness of at least about 2.0 micrometers (80 microinches.) The coating 302 also comprises a metal material that has resistance to erosion in an energized gas, such as for example, at least one of aluminum, titanium, copper and chromium. The coating 302 can furthermore comprise an exposed surface 308 that is textured, such that process residues generated in the processing of substrates 104 adhere to the surface 308 of the coating 302.

The component 300 is cleaned and refurbished after processing one or more substrates 104 to remove process residues from the component 300 and clean the upper surface 306 of the structure 304 to provide a surface 306 having characteristics that allow for enhanced bonding between the underlying structure 304 and coating 302. For example, the upper surface 306 of the structure 304 may be cleaned to remove compounds or particulates from the surface 306 of the structure 304, such as intermetallic compounds 310 that develop at the interface between the coating 302 and structure 304, as shown in FIG. 1a. The surface 306 may also be textured by roughening the surface 306 to provide better adhesion between the coating 302 and structure 304.

Figure 2:
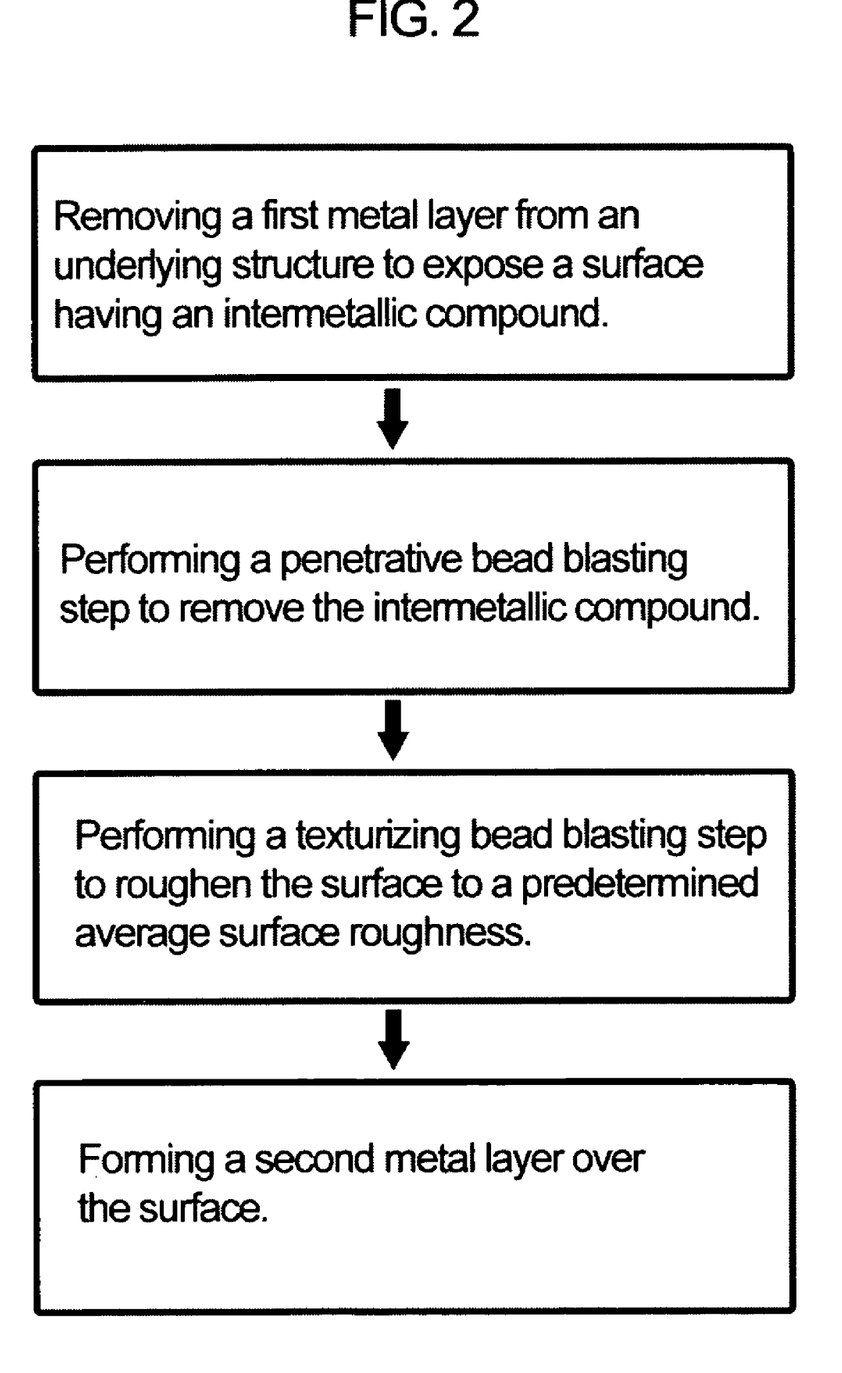
FIG. 2 is a flow chart illustrating an embodiment of a component refurbishment process.

An example of an embodiment of a cleaning and refurbishment process for a process chamber component 300 is shown in the flow chart of FIG. 2. This embodiment of the method generally comprises: removing a first metal layer 302a from the underlying structure 304 to expose a surface 306 having an intermetallic compound 310; performing a penetrative bead-blasting step to remove the intermetallic compound 310; performing a texturizing bead-blasting step to roughen the surface 306 to a predetermined average surface roughness; and forming a second metal layer 302b over the surface.

Figure 1B:
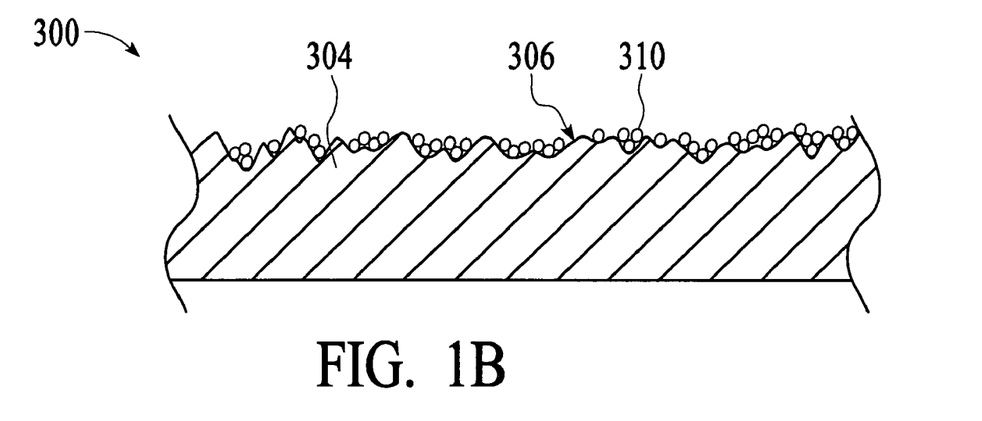
FIG. 1b is a schematic side view of the component of FIG. 1a after immersing the coating in a cleaning solution to remove the coating.

In one version, the coating 302 comprises a first metal layer 302a that is at least partially removed from the structure 304 by immersing the surface 308 of the coating 302 in a cleaning solution, such as an acidic or basic cleaning solution. A suitable acidic cleaning solution can comprise at least one of HF, $HNO_3$, HCl, $H_3PO_4$, and $H_2SO_4$. A suitable basic cleaning solution can comprise at least one of KOH, $NH_4OH$, NaOH, and $K_2CO_3$. The cleaning solution can be also tailored to remove built-up process residues from the component 300. In one version, the surface 308 is immersed in more than one cleaning solution to provide the desired removal of both the coating 302 and process residues. For example, the surface 308 of the coating 302 can be immersed in an acidic cleaning solution comprising from about 2 M to about 8 M HF, such as about 5 M HF and from about 2 M $HNO_3$ to about 15 M $HNO_3$, such as about 12 M $HNO_3$. The surface 308 is then immersed in a basic cleaning solution comprising from about 1 M to about 8 M, such as about 3 M KOH. FIG. 1a shows a component 300 to be refurbished having a coating 302, and FIG. 1b shows a component 300 from which the coating 302 has been removed by immersing in a cleaning solution as a part of the refurbishment process.

Once the coating 302 has been removed, a cleaning step is performed to remove the intermetallic compounds 310 that develop on the structure surface 306 at the interface between the underlying structure 304 and coating 302. These intermetallic compounds, as shown for example in FIGS. 1a and 1b, can include metallic species from the coating 302 and structure 304 that form a disordered conglomeration of metallic compounds between the coating 302 and structure 304. It is believed that the intermetallic compounds 310 are formed by the thermal cycling of the coated components 300 during chamber operation, which leads to the disruption of the crystalline structures of the coating 302 and underlying structure 304, and the migration of the disrupted metal species to the interface. The intermetallic compounds 310 can comprise combinations of aggregated materials from both the coating 302 and underlying structure 304, such as for example FeAl, $Fe_3Al$ and NiAl compounds, and the intermetallic compounds can also form layers of the compounds on the surface 306 of the structure 304. Formation of the intermetallic compounds between the coating 302 and the structure 304 reduces the area of contact between the surface 306 and the coating 302, and thus reduces the adherence of the coating 302 to the structure surface 306.

It has been discovered that an improved process to remove the intermetallic compounds 310 from the exposed surface 306 comprises performing a penetrative bead blasting step. In a bead blasting process, solid blasting beads 312 are propelled toward the surface 306 of the underlying structure 304 by pressurized gas. The penetrative bead blasting process is performed by selecting bead blasting conditions to penetrate cracks and crevices 311 in the surface to remove the intermetallic compounds. For example, blasting beads 312 having smaller bead diameters can be selected that are capable of better penetrating narrow cracks and crevices 311 to provide better overall intermetallic compound removal. The bead diameter can be the diameter of beads comprising a substantially spherical shape, and can also be a measure of an average size of beads that are less than perfectly spherical, such as beads comprising oblong or even cube shapes. In one example, blasting beads 312 having a diameter of less than about 180 micrometers, such as from about 80 micrometers to about 180 micrometers, and even about 100 micrometers to about 180 micrometers, such as for example, about 150 micrometers, are propelled toward the surface 306. For example, the blasting beads can consist essentially of beads having a diameter of less than about 180 micrometers. This diameter can correspond to a grit mesh size of at least about 80, such as from about 80 to about 120, and even about 100. The bead diameter can also be selected to be smaller than an average width of the crevices 311, such that the beads penetrate into the crevices. Suitable bead materials can include for example, aluminum oxide, glass, silica, or hard plastic.

The penetrative bead blasting process also uses a relatively low pressure of the gas used to propel the finer blasting beads 312. The pressure of gas used to propel the beads 312 towards the surface in the penetrative bead blasting process can be less than about 310 kiloPascals (45 pounds-per square inch), such as from about 172 kPa (25 psi) to about 310 kPa (45 psi), and even about 241 kPa (35 psi.) Other bead blasting conditions suitable to provide the penetrative bead blasting process include: an angle of incidence of the beads 312 relative to the surface 306 of from about 35 to about 90 degrees, such as from about 35 to about 55 degrees, and even about 45 degrees; and a standoff distance traveled by the beads 306 from the bead blaster to the surface 306 of the underlying structure 304 of from about 10 cm to about 25 cm, such as from about 10 cm to about 15 cm.

Figure 1C:
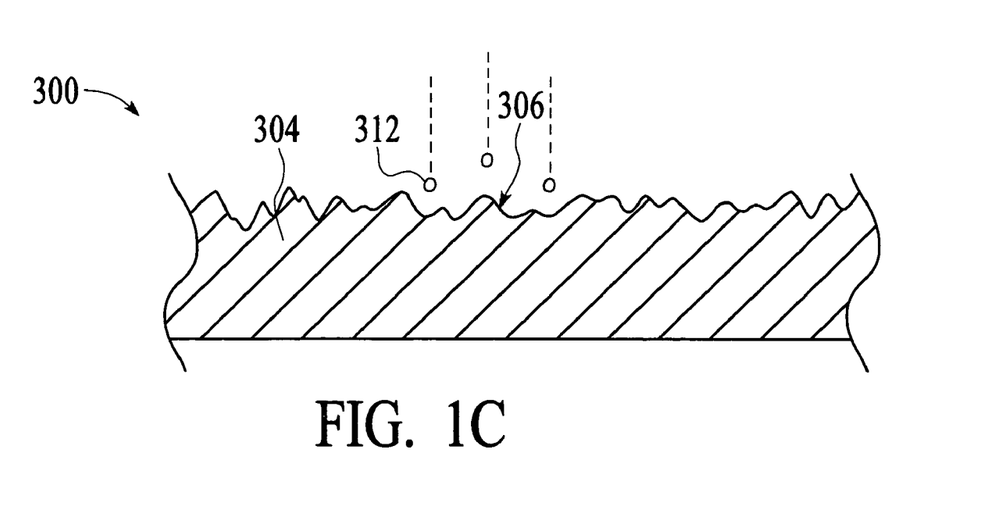
FIG. 1c is a schematic side view of the component of FIG. 1b after a penetrative bead blasting step to remove intermetallic compounds from the component.

The penetrative bead blasting process with finer beads and lower bead blasting pressures provided exceptional cleaning of the intermetallic compounds 310 on the surface 306 without damaging the underlying structure of the surface 306. The improved results provided by the relatively gentle penetrative bead blasting process are unexpected, as it was previously believed that more aggressive bead blasting processes were required for a more complete and thorough removal of intermetallic compounds 310 from the surface 306. The relatively gentler bead blasting process provides a surface 306 that is substantially absent intermetallic compounds 310, as shown for example in FIG. 1c, and thereby improves the process lifetime of the component 300, since the same component can be cleaned more times.

Figure 1D:
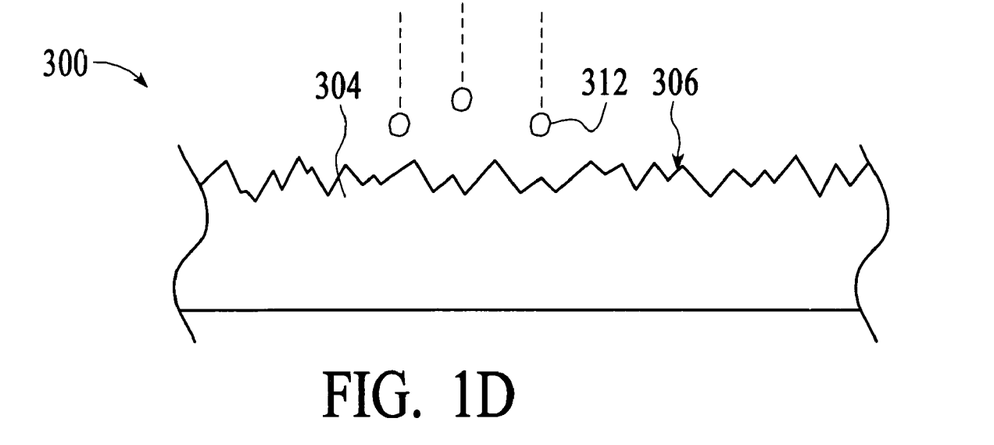
FIG. 1d is a schematic side view of the component of FIG. 1c after a texturizing bead blasting step to roughen the surface of the component.

A subsequent texturizing bead blasting step is then performed to texture the surface 306 of the underlying structure 304 to improve adhesion of the subsequently applied coating 302. The texturizing bead blasting process can be performed to restore the desired surface roughness to the surface 306, which may have been reduced, for example, by chemical cleaning solutions used to remove the coating 302. The texturizing bead blasting process desirably comprises a relatively more aggressive bead blasting process than the penetrative bead blasting process, with blasting beads 312 having larger bead diameters that excavate larger regions of the surface 306. The process can also comprise higher gas pressures that propel the beads 312 with greater force against the surface 306 to provide the predetermined surface roughness. The aggressive texturizing step desirably provides an average surface roughness of the surface 306 of the structure of at least about 3.81 micrometers (150 microinches), and even at least about 4.32 micrometers (170 microinches), such as from about 3.81 micrometers (150 microinches) to about 8.89 micrometers (350 microinches), and even from about 4.45 micrometers (175 microinchess) to about 8.89 micrometers (350 microinches.) In one version, the surface 306 of a structure 304 comprising stainless steel is bead blasted to a roughness average of from about 4.45 micrometers (175 microinches) to about 6.35 micrometers (250 microinches), such as about 5.33 micrometers (210 microinches.) In another version, the surface 306 of a structure 304 comprising titanium is bead blasted to a roughness average of from about 4.45 micrometers (250 microinches) to about 8.89 micrometers (350 microinches), such as about 7.62 micrometers (300 microinches.) An example of a component 300 roughened in the texturizing bead blasting process is shown in FIG. 1d.

In an example of a suitable texturizing bead blasting step, blasting beads 312 having a diameter of at least about 400 micrometers, such as from about 400 micrometers to about 1000 micrometers, and even about 450 micrometers, are propelled towards the surface 306 to roughen the surface 306 to a predetermined surface roughness average. This bead size can correspond to a grit mesh size of less than about 70, such as from about 24 to about 70, and even about 36. A suitable pressure of air used to propel the beads 312 can be a pressure of at least about 138 kPa (20 psi), such as from about 138 kPa (20 psi) about 827 kPa (120 psi), and even at least about 276 kPa (40 psi), such as from about 276 kPa (40 psi) to about 414 kPa (60 psi), such as about 310 kPa (45 psi.) The pressure of air may also be at least about 69 kPa (10 psi) greater than the pressure used in the penetrative bead blasting step. Other bead blasting conditions suitable to provide the texturizing bead blasting process include: an angle of incidence of the beads 312 relative to the surface 306 of from about 45 to about 90 degrees, and even from about 50 to about 70 degrees; and a standoff distance traveled by the beads 312 from the bead blaster to the surface 306 of the underlying structure 304 of from about 10 cm to about 25 cm, such as from about 10 cm to about 15 cm. The texturizing bead blasting step is preferably performed after the penetrative bead blasting step once the intermetalllic compounds have been removed. However, the texturizing step can also be performed before the penetrative blasting step, and the texturizing and penetrative bead blasting steps can be repeated in an alternating or other sequence.

In measuring properties of the surface 306 such as roughness average, the international standard ANSI/ASME B.46.1-1995 specifying appropriate cut-off lengths and evaluation lengths, can be used. The following Table I shows the correspondence between values of roughness average, appropriate cut-off length, and minimum and typical evaluation length as defined by this standard:

TABLE I

| Roughness Average | Cut-off Length | Min. Evaluation Length | Typ. Evaluation Length |
|---|---|---|---|
| 0 to 0.8 microinches (0 to 0.02 micrometers) | 0.003 inches (76.2 micrometers) | 0.016 inches (0.406 millimeters) | 0.016 inches (0.406 mm) |

TABLE I-continued

| Roughness Average | Cut-off Length | Min. Evaluation Length | Typ. Evaluation Length |
|---|---|---|---|
| 0.8 to 4 microinches (0.02 to 0.1 micrometers) | 0.010 inches (254 micrometers) | 0.050 inches (1.27 millimeters) | 0.050 inches (1.27 mm) |
| 4 to 80 microinches (0.1 to 2.0 micrometers) | 0.030 inches (762 micrometers) | 0.160 inches (4.06 millimeters) | 0.160 inches (4.06 mm) |
| 80 to 400 microinches (2.0 to 10.2 micrometers) | 0.100 inches (2.54 millimeters) | 0.300 inches (7.62 millimeters) | 0.500 inches (12.7 mm) |
| 400 microinches (10.2 micrometers) and above | 0.300 inches (7.62 millimeters) | 0.900 inches (22.9 millimeters) | 1.600 inches (40.6 mm) |

The roughness average may be measured by a profilometer that passes a needle over the surface 306 and generates a trace of the fluctuations of the height of the asperities on the surface 306 or by a scanning electron microscope that uses an electron beam reflected from the surface 306 to generate an image of the surface 306.

Figure 1E:
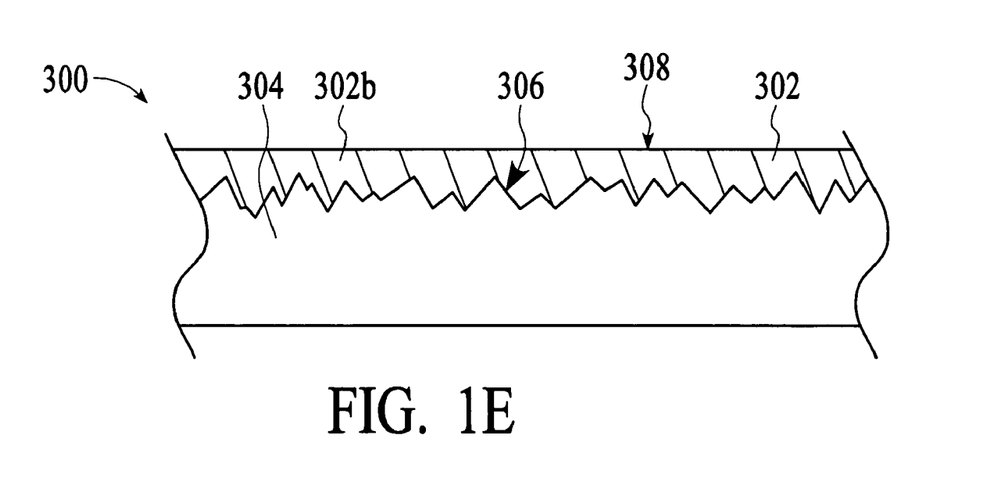
FIG. 1e is a schematic side view of the component of FIG. 1d after re-applying a coating to the component.

Once the surface 306 of the underlying structure 304 has been cleaned and textured by the above-described refurbishment process, a coating 302 comprising a second metal layer 302b is formed over at least a portion of the surface 306. The second metal layer 302b can comprise the same or different material as the first metal layer 302a, for example the second metal layer 302b can comprise one or more metals that have substantial resistance to erosion in the substrate processing chamber, such as at least one of aluminum, titanium, copper and chromium. The coating 302 is applied by a method that provides a strong bond between the coating 302 and the underlying structure 304 to protect the underlying structure 304. For example, the coating 302 may be applied by one or more of a chemical or physical deposition process, or by a flame spraying or thermal spraying method, such as a twin wire arc spray method, plasma arc spray method, or oxy-fuel gas flame. An example of a refurbished component 300 having the coating 302 comprising the second metal layer is shown in FIG. 1e.

In one version, the coating 302 comprising the metal layer 302b is applied to the cleaned surface 306 by a twin wire arc spray process, as for example described in U.S. Pat. No. 6,227,435 B1, issued on May 8, 2001 to Lazarz et al, and U.S. Pat. No. 5,695,825 issued on Dec. 9, 1997 to Scruggs, both of which are incorporated herein by reference in their entireties. In the twin wire arc thermal spraying process, a thermal sprayer (not shown) comprises two consumable electrodes that are shaped and angled to allow an electric arc to form therebetween. For example, the consumable electrodes may comprise twin wires formed from the metal to be coated on the surface, which are angled towards each other to allow an electric discharge to form near the closest point. An electric arc discharge is generated between the consumable electrodes when a voltage is applied to the consumable electrodes as a carrier gas, such as one or more of air, nitrogen or argon, is flowed between the electrodes. Arcing between the electrodes atomizes and at least partially liquefies the metal on the electrodes, and carrier gas energized by the arcing electrodes propels the molten particles out of the thermal sprayer and towards the surface 306 of the underlying structure 304. The molten particles impinge on the surface 306 of the underlying structure 304, where they cool and condense to form a conformal coating 302. When wires are used as the consumable electrodes, the wires may be continuously fed into the thermal sprayer to provide a continuous supply of the metal material.

Operating parameters during thermal spraying are selected to be suitable to adjust the characteristics of the coating material application, such as the temperature and velocity of the coating material as it traverses the path from the thermal sprayer to the underlying structure surface 306. For example, gas flows, power levels, powder feed rate, carrier gas flow, standoff distance from the thermal sprayer to the surface 306, and the angle of deposition of the coating material relative to the surface 306 can be selected to improve the application of the coating material and the subsequent adherence of the coating 302 to the underlying structure surface 306. For example, the voltage between the consumable electrodes may be selected to be from about 10 Volts to about 50 Volts, such as about 30 Volts. Additionally, the current that flows between the consumable electrodes may be selected to be from about 100 Amps to about 1000 Amps, such as about 200 Amps. The power level of the thermal sprayer is usually in the range of from about 6 to about 80 kiloWatts, such as about 10 kiloWatts.

The standoff distance and angle of deposition can also be selected to adjust the deposition characteristics of the coating material on the surface 306. For example, the standoff distance and angle of deposition can be adjusted to modify the pattern in which the molten coating material splatters upon impacting the surface, to form for example, "pancake" and "lamella" patterns. The standoff distance and angle of deposition can also be adjusted to modify the phase, velocity, or droplet size of the coating material when it impacts the surface 306. In one embodiment, the standoff distance between the thermal sprayer and the surface is about 15 cm, and the angle of deposition of the coating material onto the surface 306 is about 90 degrees.

The velocity of the coating material can be adjusted to suitably deposit the coating material on the surface 306. In one embodiment, the velocity of the powdered coating material is from about 100 to about 300 meters/second. Also, the thermal sprayer may be adapted so that the temperature of the coating material is at least about melting temperature when the coating material impacts the surface. Temperatures above the melting point can yield a coating of high density and bonding strength. For example, the temperature of the energized carrier gas about the electric discharge may exceed 5000° C. However, the temperature of the energized carrier gas about the electric discharge can also be set to be sufficiently low that the coating material remains molten for a period of time upon impact with the surface 306. For example, an appropriate period of time may be at least about a few seconds.

The thermal spraying process parameters are desirably selected to provide a coating 306 having desired structure and surface characteristics, such as for example a desired coating thickness, coating surface roughness, and the porosity of the coating, which contribute to the improved performance of the coated components. The thickness of the coating 302 can affect how well the coating 302 adheres to the underlying structure 304 and the erosion resistance of the component 300. A suitable thickness of the coating 302 may be, for example, from about 152 micrometers (0.006 inches) to about 508 micrometers (0.02 inches). For an underlying structure 304 covered by an aluminum coating 302, such as a coated stainless steel or titanium structure, a suitable thickness of the coating 302 may be from about 254 micrometers (0.01 inches) to about 508 micrometers (0.02 inches), such as about 304 micrometers (0.012 inches.) The thermal spraying process parameters can also be selected to provide a coating 302 having a textured surface 308 to which process residues can adhere. For example, the coating 302 may have a textured surface 308 having a surface roughness of from about 25 micrometers (1000 microinches) to about 50.8 micrometers (2000 microinches.)

Additional cleaning steps can also be performed to clean one or more of the coating 302 and underlying structure surface 306. For example, the underlying structure surface 306 can be cleaned after bead blasting and before the coating 302 is applied by performing an ultrasonic cleaning step in which the surface 306 of the underlying structure 304 is immersed in a cleaning bath comprising de-ionized water, and sound waves are introduced into the cleaning bath to lightly agitate the surface 306. The surface 306 can then be heated to a temperature of at least 100° C. to dry the component 300 and remove volatile impurities. The surface 308 of the coating 302 can also be cleaned in a deionized water ultrasonic cleaning step. A pressurized flow of $N_2$ can also be provided to clean the surfaces of the coating 302 or underlying structure 304.

A component 300 that has been cleaned and refurbished according to the described process shows substantially improved bonding between the coating 302 and the underlying structure 304, and improved component lifetime. For example, a component cleaned and coated according to the process provides enhanced performance in a deposition chamber 106, where sputtered material formed in the chamber 106 can accumulate on exposed surfaces of the component 300 to a thickness of at least about 100 micrometers, and even up to about 300 micrometers, substantially without causing spalling of the coating 302 from the component 300. Also, the component cleaned and refurbished according to the method can be used to process at least about 4 substrates 104 substantially without spalling of the coating 302. Additionally, the improved refurbishment process allows the coated component 300 to be refurbished and re-used at least about 15 times, substantially without failure of the component 300. In comparison, a conventional refurbishing process that does not sufficiently remove the intermetallic compounds 310, allows the component 300 to be refurbished and re-used only 5 times. Thus the present refurbishment process provides a component 300 having a lifetime that is at least twice as long as that of conventionally refurbished components 300.

An example of a suitable process chamber 106 having a component refurbished according to the process is shown in FIG. 3. The chamber 106 can be a part of a multi-chamber platform (not shown) having a cluster of interconnected chambers connected by a robot arm mechanism that transfers substrates 104 between the chambers 106. In the version shown, the process chamber 106 comprises a sputter deposition chamber, also called a physical vapor deposition or PVD chamber, that is capable of sputter depositing material on a substrate 104, such as one or more of tantalum, tantalum nitride, titanium, titanium nitride, copper, tungsten, tungsten nitride and aluminum. The chamber 106 comprises enclosure walls 118 that enclose a process zone 109, and that include sidewalls 164, a bottom wall 166, and a ceiling 168. A support ring 130 can be arranged between the sidewalls 164 and ceiling 168 to support the ceiling 168. Other chamber walls can include one or more shields 120 that shield the enclosure walls 118 from the sputtering environment.

The chamber 106 comprises a substrate support 114 to support the substrate in the sputter deposition chamber 106. The substrate support 114 may be electrically floating or may comprise an electrode 170 that is biased by a power supply 172, such as an RF power supply. The substrate support 114 can also comprise a shutter disk 133 that can protect the upper surface 134 of the support 114 when the substrate 104 is not present. In operation, the substrate 104 is introduced into the chamber 106 through a substrate loading inlet (not shown) in a sidewall 164 of the chamber 106 and placed on the support 114. The support 114 can be lifted or lowered by support lift bellows and a lift finger assembly (not shown) can be used to lift and lower the substrate onto the support 114 during transport of the substrate 104 into and out of the chamber 106.

The support 114 may also comprise one or more rings, such as a cover ring 126 and a deposition ring 128, that cover at least a portion of the upper surface 134 of the support 114 to inhibit erosion of the support 114. In one version, the deposition ring 128 at least partially surrounds the substrate 104 to protect portions of the support 114 not covered by the substrate 104. The cover ring 126 encircles and covers at least a portion of the deposition ring 128, and reduces the deposition of particles onto both the deposition ring 128 and the underlying support 114.

A process gas, such as a sputtering gas, is introduced into the chamber 106 through a gas delivery system 112 that includes a process gas supply comprising one or more gas sources 174 that each feed a conduit 176 having a gas flow control valve 178, such as a mass flow controller, to pass a set flow rate of the gas therethrough. The conduits 176 can feed the gases to a mixing manifold (not shown) in which the gases are mixed to from a desired process gas composition. The mixing manifold feeds a gas distributor 180 having one or more gas outlets 182 in the chamber 106. The process gas may comprise a non-reactive gas, such as argon or xenon, which is capable of energetically impinging upon and sputtering material from a target. The process gas may also comprise a reactive gas, such as one or more of an oxygen-containing gas and a nitrogen-containing gas, that are capable of reacting with the sputtered material to form a layer on the substrate 104. Spent process gas and byproducts are exhausted from the chamber 106 through an exhaust 120 which includes one or more exhaust ports 184 that receive spent process gas and pass the spent gas to an exhaust conduit 186 in which there is a throttle valve 188 to control the pressure of the gas in the chamber 106. The exhaust conduit 186 feeds one or more exhaust pumps 190. Typically, the pressure of the sputtering gas in the chamber 106 is set to sub-atmospheric levels.

The sputtering chamber 106 further comprises a sputtering target 124 facing a surface 105 of the substrate 104, and comprising material to be sputtered onto the substrate 104. The target 124 is electrically isolated from the chamber 106 by an annular insulator ring 132, and is connected to a power supply 192. The sputtering chamber 106 also has a shield 120 to protect a wall 118 of the chamber 106 from sputtered material. The shield 120 can comprise a wall-like cylindrical shape having upper and lower shield sections 120a, 120b that shield the upper and lower regions of the chamber 106. In the version shown in FIG. 3, the shield 120 has an upper section 120a mounted to the support ring 130 and a lower section 120b that is fitted to the cover ring 126. A clamp shield 141 comprising a clamping ring can also be provided to clamp the upper and lower shield sections 120a,b together. Alternative shield configurations, such as inner and outer shields, can also be provided. In one version, one or more of the power supply 192, target 124, and shield 120, operate as a gas energizer 116 that is capable of energizing the sputtering gas to sputter material from the target 124. The power supply 192 applies a bias voltage to the target 124 with respect to the shield 120. The electric field generated in the chamber 106 from the applied voltage energizes the sputtering gas to form a plasma that energetically impinges upon and bombards the target 124 to sputter material off the target 124 and onto the substrate 104. The support 114 having the electrode 170 and support electrode power supply 172 may also operate as part of the gas energizer 116 by energizing and accelerating ionized material sputtered from the target 124 towards the substrate 104. Furthermore, a gas energizing coil 135 can be provided that is powered by a power supply 192 and that is positioned within the chamber 106 to provide enhanced energized gas characteristics, such as improved energized gas density. The gas energizing coil 135 can be supported by a coil support 137 that is attached to a shield 120 or other wall in the chamber 106.

The chamber 106 is controlled by a controller 194 that comprises program code having instruction sets to operate components of the chamber 106 to process substrates 104 in the chamber 106. For example, the controller 194 can comprise a substrate positioning instruction set to operate one or more of the substrate support 114 and substrate transport to position a substrate 104 in the chamber 106; a gas flow control instruction set to operate the flow control valves 178 to set a flow of sputtering gas to the chamber 106; a gas pressure control instruction set to operate the exhaust throttle valve 188 to maintain a pressure in the chamber 106; a gas energizer control instruction set to operate the gas energizer 116 to set a gas energizing power level; a temperature control instruction set to control temperatures in the chamber 106; and a process monitoring instruction set to monitor the process in the chamber 106.

Although exemplary embodiments of the present invention are shown and described, those of ordinary skill in the art may devise other embodiments which incorporate the present invention, and which are also within the scope of the present invention. For example, other chamber components than the exemplary components described herein can also be cleaned. Other cleaning steps can also be used in combination with those described. Furthermore, relative or positional terms shown with respect to the exemplary embodiments are interchangeable. Therefore, the appended claims should not be limited to the descriptions of the preferred versions, materials, or spatial arrangements described herein to illustrate the invention.

What is claimed is:

1. A refurbished component for a process chamber, the component comprising a titanium structure having a refurbished textured titanium metal coating, wherein the component is refurbished by:
   (i) immersing the component in a cleaning solution to remove an original titanium coating to expose an intermetallic compound on the titanium structure of the component;
   (ii) removing the intermetallic compound by bead blasting with blasting beads having a bead diameter of less than about 180 micrometers propelled by a gas pressurized to a pressure of less than about 45 psi to form an exposed surface of the structure;
   (iii) texturizing the exposed surface of the titanium structure by bead blasting with blasting beads having a bead diameter of less than about 1000 micrometers, the blasting beads being propelled by a gas pressurized to a pressure of less than about 60 psi, to form a textured surface having a surface roughness average of from about 150 microinches to about 350 microinches; and
   (iv) forming the refurbished textured titanium metal coating on and in contact with the textured surface of the titanium structure by twin-wire arc spray coating,
   whereby the refurbished component is capable of being refurbished by the method at least about 15 times substantially without failure of the component.

2. A component according to claim 1 wherein the component comprises at least a portion of an enclosure wall, chamber shield, target, cover ring, deposition ring, support ring, insulator ring, coil, coil support, shutter disk, clamp shield or substrate support.

3. A component according to claim 1 wherein the intermetallic compound comprises at least one of aluminum, titanium, stainless steel, copper and tantalum.

4. A component according to claim 1 wherein in (i) the cleaning solution comprises an acidic or basic solution to dissolve the original titanium coating.

5. A component according to claim 1 wherein in (i) the cleaning solution comprises HF and $HNO_3$.

6. A component according to claim 1 wherein (ii) comprises bead blasting the intermetallic compound with blasting beads having a bead diameter greater than about 80 micrometers.

7. A component according to claim 1 wherein (ii) comprises bead blasting the intermetallic compound by propelling blasting beads towards the intermetallic compound with a gas that is pressurized to a pressure of greater than about 25 psi.

8. A component according to claim 1 wherein in (iii) the texturizing bead blasting step comprises propelling blasting beads having a bead diameter of greater than about 400 micrometers at the exposed surface of the structure with gas that is pressurized to a pressure of at least about 40 psi.

9. A component according to claim 1 wherein the exposed surface of the structure comprises crevices, and wherein the bead diameter of the blasting beads is selected to be smaller than the average width of the crevices, whereby the blasting beads can penetrate into the crevices to remove the intermetallic compound.

10. A component according to claim 1 wherein (iv) comprises generating an electrical arc that at least partially liquefies a titanium coating material, and passing a pressurized gas past the liquefied titanium coating material to propel the liquefied titanium coating material towards the textured surface.

11. A substrate processing chamber component comprising:
    (a) a titanium structure comprising at least a portion of an enclosure wall, chamber shield, cover ring or deposition ring; and
    (b) a titanium metal coating on and in contact with the titanium structure, the titanium metal coating having a textured surface.

12. A component according to claim 11 wherein the titanium metal coating comprises a twin-wire arc sprayed titanium coating.

13. A component according to claim 11 wherein the titanium metal coating has a thickness of from about 6 to about 20 microinches.

14. A component according to claim 11 wherein the titanium metal coating comprises a surface roughness of from about 1000 microinches to about 2000 microinches.

15. A substrate processing chamber component comprising:
(a) a structure made from titanium, the titanium structure comprising at least a portion of an enclosure wall, chamber shield, cover ring or deposition ring; and
(b) a titanium metal coating on and in contact with the titanium structure, the titanium coating having a textured surface.

16. A component according to claim 15 wherein the titanium metal coating comprises a twin-wire arc sprayed titanium metal coating.

17. A component according to claim 15 wherein the titanium metal coating has a thickness of from about 6 to about 20 microinches.

18. A component according to claim 15 wherein the titanium metal coating comprises a surface roughness of from about 1000 microinches to about 2000 microinches.

19. A substrate processing chamber component comprising:
(a) a structure made from titanium, the titanium structure comprising at least a portion of an enclosure wall, chamber shield, cover ring or deposition ring; and (b) a titanium metal coating on and in contact with the titanium structure, the titanium metal coating comprising a twin-wire arc sprayed titanium metal coating having a textured surface.

20. A component according to claim 19 wherein the titanium metal coating has a thickness of from about 6 to about 20 microinches.

21. A component according to claim 19 wherein the titanium metal coating comprises a surface roughness of from about 1000 microinches to about 2000 microinches.

22. A substrate processing chamber component comprising:
(a) a titanium structure comprising at least a portion of an enclosure wall, chamber shield, cover ring or deposition ring; and
(b) a titanium metal coating on and in contact with the titanium structure, the titanium metal coating comprising a twin-wire arc sprayed titanium metal coating having a textured surface and a thickness of from about 6 to about 20 microinches.

23. A component according to claim 22 wherein the titanium metal coating comprises a surface roughness of from about 1000 microinches to about 2000 microinches.

* * * * *